(12) United States Patent
Salomir et al.

(10) Patent No.: US 8,630,471 B2
(45) Date of Patent: Jan. 14, 2014

(54) METHOD TO DETERMINE A BACKGROUND PHASE IN PHASE IMAGE DATA SETS

(75) Inventors: Rares Salomir, Ambilly (FR); Magalie Viallon, Lyons (FR); Joerg Roland, Hemhofen (DE); Patrick Gross, Langensendelbach (DE)

(73) Assignee: Siemens Aktiengesellschaft, Munich (DE)

( * ) Notice: Subject to any disclaimer, the term of this patent is extended or adjusted under 35 U.S.C. 154(b) by 447 days.

(21) Appl. No.: 12/970,184

(22) Filed: Dec. 16, 2010

(65) Prior Publication Data

US 2011/0176714 A1 Jul. 21, 2011

(30) Foreign Application Priority Data

Dec. 16, 2009 (DE) .......................... 10 2009 058 510

(51) Int. Cl.
*G06K 9/00* (2006.01)
(52) U.S. Cl.
USPC ........................................................ 382/131
(58) Field of Classification Search
None
See application file for complete search history.

(56) References Cited

U.S. PATENT DOCUMENTS

| | | | |
|---|---|---|---|
| 4,954,779 A | 9/1990 | Zur | |
| 5,113,865 A | 5/1992 | Maeda et al. | |
| 6,681,035 B1 * | 1/2004 | Bamford et al. | 382/133 |
| 7,505,805 B2 | 3/2009 | Kuroda | |

OTHER PUBLICATIONS

Rieke, Viola, et al. "Referenceless PRF shift thermometry." Magnetic resonance in medicine 51.6 (2004): 1223-1231.*

Li, Lin, and John S. Leigh. "High-precision mapping of the magnetic field utilizing the harmonic function mean value property." Journal of magnetic resonance 148.2 (2001): 442-448.*
Rieke, Viola, et al. "Referenceless MR thermometry for monitoring thermal ablation in the prostate." Medical Imaging, IEEE Transactions on 26.6 (2007): 813-821.*
Teles, J., C. E. Garrido, and A. Tannús. "A convenient procedure for magnetic field homogeneity evaluation." Journal of Physics D: Applied Physics 37.14 (2004): 1877.*
"Invariant Measures of Image Features from Phase Information," Kovesi, Dissertation, Department of Physiology, University of estern Australia (1996).
"MR Thermometry," Rieke et al., Journal of Magnetic Resonance Imaging. vol. 27 (2008) pp. 376-390.
Decomposition of Three-Dimensional Medical Images into Visual Patterns, Dosil et al., IEEE Trans. on Biomedical Engineering, Vo. 52, No. 12 (2005) pp. 215-218.
"A Convenient Procedure for Magnetic Field Homogeneity Evaluation," Teles et al., Journal of Physics D: Applied Physics, vol. 37 (2004) pp. 1877-1880.
"Referenceless PRF Shift Thermometry," Rieke et al., Magnetic Resonance in Medicine, vol. 51 (2004) pp. 1223-1231.
"Referenceless MR Thermometry for Monitoring Thermal Ablation in the Prostate," Rieke et al., IEEE Trans. on Medical Imaging, vol. 26. No. 6 (2007) pp. 813-821.
"Evaluation of Referenceless Thermometry in MRI-Guided Focused Ultrasound Surgery of Uterine Fibroids," McDannold et al., Journal of Magnetic Resonance Imaging, vol. 28 (2008) pp. 1026-1032.

* cited by examiner

*Primary Examiner* — Stephen R Koziol
*Assistant Examiner* — Raphael Schwartz (57) ABSTRACT

In a method to determine a background phase in phase values of a phase image data set that is acquired from an examination subject, wherein the background phase is determined in a partial region of the phase image data set, the phase image data set of the examination subject is acquired, and a substantially closed, planar contour is established in the phase image data set around the partial region, the planar contour having a contour area with a width of at least one pixel of the phase image data set. The phase values in the partial region are determined with the assumption that the spatial curve of the background phase is a harmonic or quasi-harmonic function, the phase values of the pixels in the partial region being determined based on the phase values in the planar contour.

17 Claims, 8 Drawing Sheets

METHOD TO DETERMINE A BACKGROUND PHASE IN PHASE IMAGE DATA SETS

BACKGROUND OF THE INVENTION

1. Field of the Invention

The present invention concerns a method to determine a background phase in phase values of a phase image data set and a device to determine the background phase.

2. Description of the Prior Art

The phase information of the magnetic resonance signal that describes the rotation of the local magnetization vector in the plane orthogonal to the $B_0$ field direction can be used in many regards in magnetic resonance tomography (MRT). For example, the phase information contained in the MR signal can be used to separate adipose and aqueous tissue, for flow measurement, in susceptibility-weighted MRT and to determine temperature. In a method known as thermotherapy the temperature in tumor cells is specifically increased in order to kill the tumor cells or to make these more sensitive to accompanying therapy measures. For example, the tissue heating can hereby ensue via focused ultrasound or with the aid of lasers. A temperature monitoring of the heated tissue is required in order to not destroy the healthy tissue via the increased temperature. In addition to invasive temperature measurement with temperature probes placed in the heated tissue, some MR parameters (such as the chemical shift, the T1 relaxation time or the diffusion constant) can be used for non-invasive temperature measurement.

In temperature monitoring based on the temperature dependency of the chemical shift, the resonance frequency altered by the temperature change is detected as an additional phase shift of the complex MR signal in a voxel (image point). In temperature imaging based on the chemical shift only temperature changes can be shown, for example by taking the difference of two phase image data sets that were acquired at different temperatures. The phase image data set acquired at a known initial temperature hereby serves as a reference data set from which the subsequent phase image data sets are subtracted. These methods operating with reference data sets have the disadvantage that movements of the examination subject during the acquisition of the two data sets or other external interferences lead to phase changes that are incorrectly interpreted as temperature changes. Furthermore, the $B_0$ field constancy over time and a current drift in the shim coils play a role since these also lead to phase changes in the detected signal that can likewise be incorrectly identified as temperature changes. In addition to these methods with reference image data sets there are techniques known as reference-less methods in which a temperature is concluded from only the measured phase values. These methods have the disadvantage that information about how the MR system-dependent background phase changes spatially over the image must be present. The phase position in a pixel is affected not only by the frequency of the magnetization in this pixel but also by system components, for example the RF receiver or the demodulator.

U.S. Pat. No. 7,505,805 describes a method to determine temperature with phase images using the reference-less approach.

In Magn Reson Med 2004 June; 51(6), P. 1223-31, Rieke et al, have described a method in which the phase information from an outer edge of an ROI (Region of Interest) is used in order to interpolate the background phase values in the heated regions. A polynomial of lower order was hereby used. However, there is no physical or mathematical basis for the use of such polynomials. The precision of the procedure is sufficient for small regions and for situations in which the background phase—i.e. the system-induced phase information—changes only slowly across the image. However, in regions in which the susceptibility changes a fast spatial change of the background phase occurs. The determination of the polynomial is likewise computationally expensive and can lead to problems in the calculation.

In Medical Imaging, IEEE Transaction on Volume 26, 6th Edition, June 2007, Pages 813-821, Rieke et al. have described the use of specific MR pulse sequences with which an independent imaging of fat and water is possible, wherein the fat signal is not temperature-dependent and therefore can be used to extract the background phase. However, a special anatomy in which sufficient fat is present is necessary for this. Moreover, the spectral line of the adipose signal is subject to changes from one location to another, which leads to different phase values over the different resonance frequencies, whereby problems occur in the determination of the background phase with the aid of the adipose signal portions.

SUMMARY OF THE INVENTION

An object of the present invention is to provide a method with which the background phase in phase values of an MR image data set can be determined in a simple manner without using reference data sets.

According to a first aspect of the invention, a method is provided to determine a background phase for a phase image data set wherein the background phase is determined in a partial region of the phase image data set. In a first step of the method according to the invention the phase image data set of the examination subject is acquired. In a second step a closed or nearly closed in-plane contour in the phase image data set is established around the partial region, wherein the planar contour has a contour area with a width of at least one pixel. Furthermore, the phase values in the partial region (i.e. the background phases in the partial region) are determined via a method that is based on the assumption that the spatial curve of the background phase corresponds to a harmonic or quasi-harmonic function, wherein the phase values of the pixels are determined based on the phase values in the planar contour. In one embodiment the phase values are determined via iterative application of a filter kernel to the pixels in the partial region and the pixels in the planar contour. The phase values of the pixels in the partial region are determined by application of the filter kernel and use of the phase values from the planar contour in order to determine the background phase. Using the filter kernel it is possible to extend the phase values that are present in the planar contour to the partial region within the contour, wherein the application of the filter kernel can be based on mathematical and physical considerations (as is explained below in detail).

The planar contour is advantageously placed in a region of the examination subject in which the tissue that is shown in the phase image data set exhibits an essentially homogeneous susceptibility. This means that the method described in the present invention delivers good results if it is assumed that the susceptibility follows a harmonic function, which means that it can be continuously differentiated twice and application of the Laplace operator to the function yields zero. The Dirichlet problem—namely the determination of the values within a contour—can be solved with the filter kernel if the values of the contour are known.

The filter kernel is advantageously a 3×3 filter kernel that respectively has a 0 in the diagonals in its matrix elements and possesses the value ¼ in the remaining matrix elements. The filter kernel F therefore is as follows:

$$F = \begin{pmatrix} 0 & 1/4 & 0 \\ 1/4 & 0 & 1/4 \\ 0 & 1/4 & 0 \end{pmatrix}$$

Other filter kernels are naturally also possible. For example, a larger filter kernel can also be used, or the individual matrix elements of the filter kernel can have other filter coefficients. However, given larger filter kernels the computational cost to calculate the phase values of the background phase is greater and tests have shown that the aforementioned filter kernel delivers the best results.

The determination of the phase values in the partial region advantageously ensues by folding the phase values in the partial region and the phase values in the planar contour with the filter kernel. If the folding does not occur with the acquired raw data but rather in image space, the folding corresponds to a convolution of the phase pixels in the partial region and the planar contour with the filter contour since a folding in raw data space after Fourier transformation into the image data space corresponds to a multiplication.

Given the iterative application of the filter kernel the phase values in the planar contour are respectively reset to their original phase value (i.e. to the acquired phase value that was measured in the tissue with homogeneous susceptibility) before the next application of the filter kernel. In each iteration the phase values in the partial region are then calculated with the aid of the original phase values in the planar contour and the phase values already calculated in the partial region based on the filter kernel.

In a preferred embodiment the phase image data set is acquired as a two-dimensional phase image data set and the iterative determination of the phase values occurs in the partial region under the assumption that the spatial curve of the background phase is a harmonic function, wherein in the iteration a parameter $\epsilon$ is furthermore used that represents the non-harmonic portion of the spatial phase curve. This means that the application of the Laplace operator to the phase in two dimensions does not yield zero but rather yields a parameter $\epsilon$. This parameter $\epsilon$ is used as follows in the first iteration: in a first step the convolution of the phase values with the filter kernel takes place, wherein this corresponds to a convolution in image space. The parameter $\epsilon$ is then subtracted from this convolution result. In a second step the phase values of pixels outside of the planar contour are set to zero, and in a third step the phase values in the planar contour are reset to their original value so that the measured phase information (that is deemed to be reliable) is retained for the next application steps of the filter kernel. After this the first step is repeated. The parameter $\epsilon$ can be assumed as a constant or can be a linearly varying function.

The iteration can be repeated until the difference in the phase values in the partial region between two iteration steps is smaller than a determined limit value, or when a specific number of iteration steps (that can depend on the size of the partial region, for example) has been implemented. This described iteration has the advantage that it converges for all cases, meaning that the background phases in the partial region converge into a spatial phase surface or map that corresponds to the MR system-dependent background phase.

An imaging sequence that is sensitive to local magnetic field differences is advantageously used to create the phase image data set. For example, a fat-suppressed, two-dimensional gradient echo sequence can be used, wherein the fat suppression prevents interfering signal portions of fat and therefore prevents spectroscopic phase shift in the pixels.

In the calculation of the background phase values the calculation can be simplified if it is assumed that the at least nearly closed contour is fashioned to be circular and furthermore comprises at least one semicircle. If the contour that is used is not completely closed, this can be closed via a contour extension to form a closed contour. In this case the phase values in the contour extension are determined first with the aid of the phase values in the pixels of the incompletely closed contour, and the phase values in the partial region are subsequently determined as described above if a completely closed contour is assumed. It can in turn be assumed that the phase curve along the circular perimeter corresponds to a harmonic function that can be described as a Fourier series, wherein the function is approximated only via the use of a specific number of Fourier coefficients.

The method described above to determine the background phase can be used in temperature imaging to determine a temperature increase or a temperature decrease. The at least nearly closed contour is hereby placed in an unheated region of the tissue that surrounds the heated region, wherein the background phase is calculated in the heated region in order to calculate the temperature with the aid of the measured phase values and the reconstructed background phase.

The invention additionally concerns a device to determine the background phase, with a memory unit in which the phase image data set is stored and provided to input the nearly closed, planar contour into the phase image data set. A computer can then calculate the phase values in the partial region (that correspond to the reconstructed background phase) as described, via iterative application.

The present invention also encompasses a non-transitory computer-readable storage medium that is encoded with programming instructions. The programming instructions, when the storage medium is loaded into a computerized processor, cause the processor to implement the above-described method, including all embodiments thereof.

DESCRIPTION OF THE PREFERRED EMBODIMENTS

Figure 1:
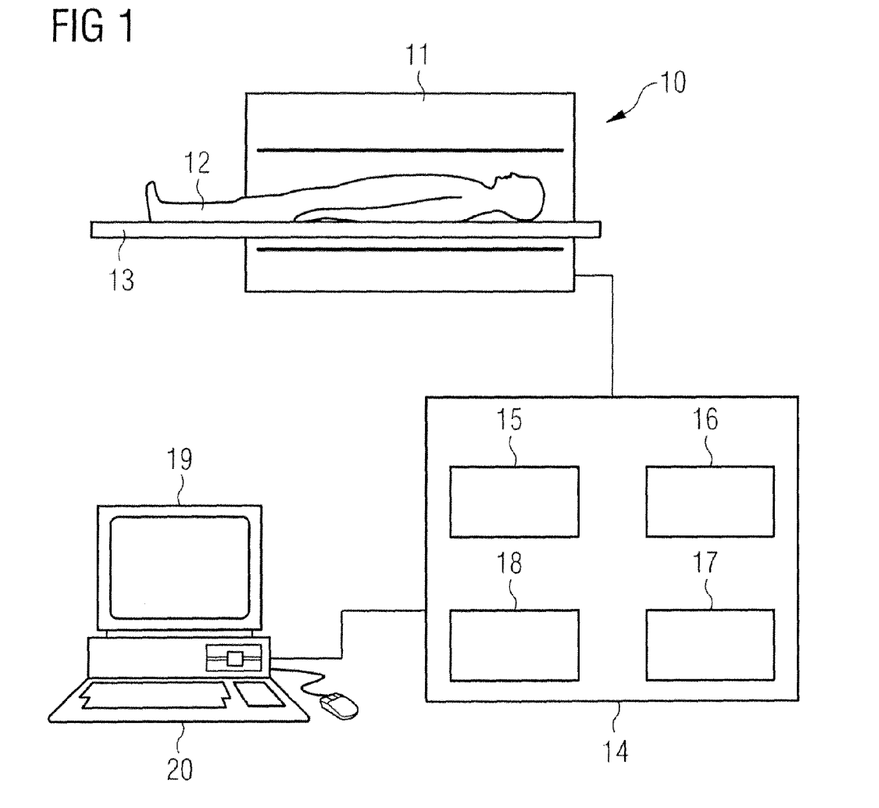
FIG. 1 schematically illustrates an MR system with which the background phase can be calculated.

An MR system with which system-dependent phase information or, respectively, the background phase can be determined is schematically shown in FIG. 1. The MR system has a basic field magnet 11 to generate a $B_0$ field into which an examined person 12 (arranged on a bed 13) can be inserted. The shown MR system can be used, for example, in combination with a thermotherapy in which individual regions of the examined body are heated (with ultrasound, for example) in order to destroy localized tumor tissue in a heated region. The temperature development in the shown tissue can be non-invasively checked in multiple dimensions with the acquisition of MR phase images of a gradient echo sequence and the presentation of phase images. The MR system has a central control unit 14 with which the control of the MR system is possible. Since the fundamental mode of operation to generate MR images is known to the man skilled in the art, only a few system components are schematically dealt with in the following. An RF control unit 15 controls the radiation of RF pulses into the examination subject; a gradient unit 16 controls the switching of the gradients necessary for spatial coding. An image acquisition unit 18 controls the time sequence of the radiation of the RF pulses and the gradient shifts and the detection of the MR signal depending on the selected imaging sequence. A computer 17 can then calculate the background phase from the calculated MR phase image data sets as is explained in detail in the following. The generated MR image data can be shown on a display unit 19, wherein (for example) a planar contour in a phase image data set can be marked around a partial region in which information about the background phase is desired. The method described in the following can be used in non-invasive temperature imaging, but the calculation of the background phase is also important for other application fields, for example in susceptibility-weighted MRT, in flow measurement, in the determination of the fat content in a tissue etc.

The theoretical bases that play a role in the calculation of the background phase are shown in the following. Given a uniform temperature, the magnetic field of a spin system with water protons at the origin location reads as follows:

$$\|\vec{B}_{nuc}\| \cong B_{nuc,z} = H_0 \cdot \left(1 - \sigma + \frac{\chi}{3}\right) + h_{m,z} + h_{sub,z} \quad (1)$$

The magnetic field is approximated as a magnetic field parallel to the z-axis, i.e. along the $B_0$ field direction. Furthermore, the permittivity of a vacuum was set to 1 for simplification, σ is the local chemical shift of the water protons, wherein this chemical shift is temperature-dependent with −0.01 pm/° C. $\chi$ is the local susceptibility, $h_{in,z}$ describes the hardware-induced inhomogeneity (for example due to the superconducting coil or the shim coils) and $h_{sub,z}$ is the demagnetization field of the subject. It additionally applies that $$h_{sub,z} = \frac{\partial \Phi_{sub}}{\partial z} \quad (2)$$

$$\nabla^2 \Phi_{sub} = H_0 \frac{\partial \chi}{\partial z} \quad (3)$$

Given a uniform temperature the chemical shift σ is constant. If a gradient echo is measured, the following connection thus exists between phase and echo time and the local magnetic field at the origin location:

$$\phi = \gamma \cdot B_{nuc,z} \cdot TE \quad (4)$$

wherein TE is the echo time at which the MR signal occurs and γ is the gyromagnetic ratio. If the Laplace operator is now applied on both sides of Equation (4) and the information of Equations (1)-(3) is used, the following Equation follows $$\begin{aligned}
\nabla^2 \varphi &= \gamma \cdot TE \cdot \nabla^2 \cdot B_{nuc,z} \quad (5)\\
&= \gamma \cdot TE \cdot \nabla^2 \left(\frac{H_0}{3} \cdot \chi - \frac{\partial \Phi}{\partial z}\right) = \\
&= \gamma \cdot TE \cdot H_0 \left[\frac{H_0}{3} \nabla^2 \chi - \frac{\partial}{\partial z}(\nabla^2 \Phi)\right] \\
&= \gamma \cdot TE \cdot H_0 \left[\frac{1}{3} \nabla^2 \chi - \frac{\partial^2 \chi}{\partial z^2}\right] \\
&= \gamma \cdot TE \cdot H_0 \cdot \hat{O}(\chi)
\end{aligned}$$

wherein the operator $\hat{O}$ is as follows $$\hat{O} = \frac{1}{3}\frac{\partial^2}{\partial x^2} + \frac{1}{3}\frac{\partial^2}{\partial y^2} - \frac{2}{3}\frac{\partial^2}{\partial z^2} \quad (6)$$

In the case of a uniform susceptibility or linearly varying susceptibility, the last term is nulled:

$$\hat{O}_\chi = 0 \quad (7)$$

If his is the case, the background phase is a harmonic function:

$$\nabla^2 \varphi = \left(\frac{\partial^2}{\partial x^2} + \frac{\partial^2}{\partial y^2} + \frac{\partial^2}{\partial z^2}\right)\varphi = 0 \quad (8)$$

Equation (7) is approximated to be two-dimensional since phase image data sets are typically acquired as two-dimensional slices images and due to the reduced calculation time.

$$\nabla^2 \varphi = \left(\frac{\partial^2}{\partial \rho^2} + \frac{\partial^2}{\partial \xi^2}\right)\varphi = \varepsilon \quad (9)$$

wherein ρ and ξ are the 2D Cartesian coordinates. The application of the 2D Laplace operator instead of the 3D Laplace operator is an approximation here, wherein the second derivation can be approximated by a constant ε in the image plane. For example, this constant ε can be determined in previous test measurements or by the following consideration:

If the phase φ(r,θ) is considered along a circle with given radius R in two dimensions, wherein the phase transition in the phase values was corrected for 2π jumps, i.e., unwrapped, the following applies:

$$\langle \varphi(r, \theta) \rangle_{r=R} = F(R) \tag{10}$$

$$= \frac{\int_0^{2\pi} \varphi(R, \theta) \cdot R \cdot d\theta}{\int_0^{2\pi} R \cdot d\theta}$$

$$= \frac{1}{2 \cdot \pi} \int_0^{2\pi} \varphi(R, \theta) d\theta$$

This depends only on R since the variable θ is filtered out by the integral with the fixed limits. Functions with two variables whose Laplace terms are constant for the phase development given acquisition with an epigradient echo sequence are $x^2$ or $y^2$ or any linear combination of these.

The ratio of F(R) is subsequently shown with $\phi(r,\theta) = ax^2 = ar^2\cos^2\theta$. Using general integration rules, the following applies:

$$F(R) = \frac{1}{2 \cdot \pi} \int_0^{2\pi} a \cdot R^2 \cdot \cos^2\theta \cdot d\theta \tag{11}$$

$$= \frac{a \cdot R^2}{2 \cdot \pi} \cdot \int_0^{2\pi} \frac{1 + \cos(2\theta)}{2} \cdot d\theta$$

$$= \frac{a \cdot R^2}{2 \cdot \pi} \cdot \pi$$

$$= \frac{a \cdot R^2}{2}$$

A constant value (i.e. a constant value independent of R) should be added to F(R) because of the harmonic component of the phase value map (i.e. the primary component). This is based on the fundamental averaging property of harmonic functions on a sphere (here a circle given two-dimensional consideration). It then follows from Equation (11) that $$F(R) = \frac{a \cdot R^2}{2} + C \tag{12}$$

In order to eliminate C, the values of F(R) are subtracted from one another given different radii, for example given the radius values R and R+2:

$$F(R+2) - F(R) = \frac{a}{2} \cdot [(R+2)^2 - R^2] \tag{13}$$

$$= 2 \cdot a \cdot (R+1)$$

The two circles with radii R and R+1 (which corresponds to an edge with a width of two pixels) can be used; however, this approach is more subject to noise since the contrast-to-noise ratio of the above Equation is half as large.

Moreover, $\nabla^2(a \cdot x^2) = 2 \cdot a = 4 \cdot \epsilon = cst$ applies, wherein ε is the auxiliary term in the iterative folding (as is explained in detail in the following) and corresponds to one fourth of the Laplace operator and is assumed to be spatially uniform. Since a in the last two Equations is the same constant, the following basic relationship applies:

$$F(R+2) - F(R) = 4 \cdot \epsilon \cdot (R+I) \tag{14}$$

The same correlation can be shown for an aharmonic term in the phase for $y^2$ and likewise for every linear combination of the type $ax^2 + by^2$. Via a similar calculation one obtains:

$$F(R) = \frac{(a+b) \cdot R^2}{2} + C \text{ and} \tag{15}$$

$$\nabla^2(a \cdot x^2 + b \cdot y^2) = 2 \cdot (a+b) = 4 \cdot \epsilon = cst$$

It follows from this that ε can be calculated as follows:

$$\epsilon = \frac{F(R+2) - F(R)}{4 \cdot (R+1)} = \frac{\text{average phase at the radius } (R+2) - \text{average phase at the radius } (R)}{4 \cdot (R+1)} \tag{16}$$

The value R and the middle point of the circle are both random. The circle with radius R is designated as the inner edge and the circle with radius R+2 is designated as the outer edge.

The circle (R·cos θ, R·sin θ) must be interpolated for a numerical implementation of F(R), wherein θ is a multiple of an arbitrarily defined unit step width, for example a circle that is filled with phase values. However, a circle radius of five pixels can be necessary for this purpose.

A simpler solution is to implement a summation along the pixels of the circle with respective weighting for the individual pixels, with $w_{i,j} = \sqrt{(i-cx)^2 + (j-cy)^2}$. Due to the limited resolution without interpolation, a digital circle is defined as a collection of pixels whose center points are spaced from the zero point, with a distance that lies between R−0.5 and R+0.5.

The constant ε thus describes the deviation of the function curve in the plane from a harmonic function.

Furthermore, it can be shown that a spatially constant, two-dimensional Laplace operator is invariant with regard to translation, such that the value for ε does not need to be re-measured given movement of the examination subject. In the event that $\nabla^2\phi(x,y)=\epsilon$, it follows that:

$$\nabla^2 \varphi(x + x_0, y + y_0) = \left(\frac{\partial^2}{\partial x^2} + \frac{\partial^2}{\partial y^2}\right)\varphi(x + x_0, y + y_0) = \tag{17}$$

$$\left(\frac{\partial(x+x_0)}{\partial x}\frac{\partial}{\partial(x+x_0)}\frac{\partial(x+x_0)}{\partial x}\frac{\partial}{\partial(x+x_0)} + \frac{\partial(y+y_0)}{\partial y}\frac{\partial}{\partial(y+y_0)}\frac{\partial(y+y_0)}{\partial y}\frac{\partial}{\partial(y+y_0)}\right)\varphi(x+x_0, y+y_0) =$$

$$\left(\frac{\partial^2}{\partial(x+x_0)^2} + \frac{\partial^2}{\partial(y+y_0)^2}\right)\varphi(x+x_0, y+y_0) =$$

$$\left(\frac{\partial^2}{\partial x'^2} + \frac{\partial^2}{\partial y'^2}\right)\varphi(x', y') = \epsilon$$

The background phase within a partial region can now be reconstructed using the phase information in a contour surrounding the partial region that is itself fashioned in turn to be planar and encloses a few pixels. In the event that the background phase can be calculated, the temperature development can be determined as follows:

Temperature=proportionality constant×(measured phase−reconstructed background phase).

Among other things, the temperature dependency of the chemical shift, the gyromagnetic ratio and the echo time are contained in the proportionality constant.

The method with which the background phase in an MR phase image data set can be determined with greater precision is now explained in detail in connection with FIG. 2-4.

Figure 2:
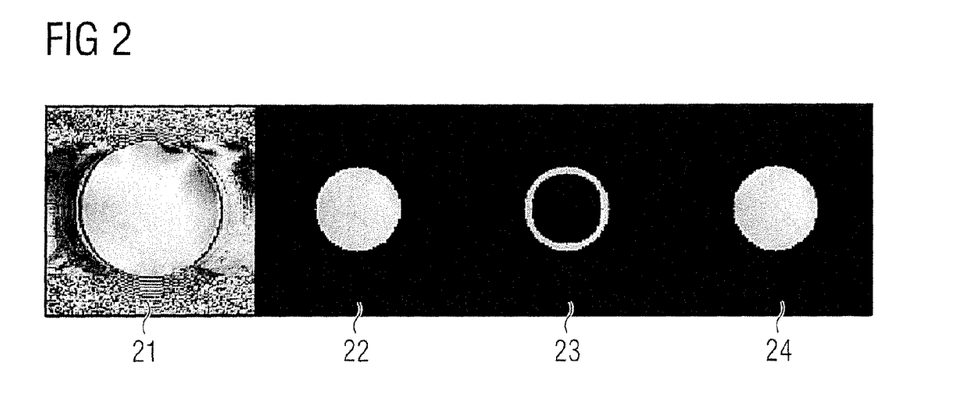
FIG. 2 is a phase image of an examination subject and a region of interest for which the background phase should be determined, with depiction of the planar contour and the calculated background phase.

A phase image data set of an examination subject is shown at the left image border in FIG. 2. The phase values of −180° to +180° (shown in greyscales) have a certain phase curve in the examination subject. For example, if it is now assumed that the inside of the examination subject should be heated and the temperature should be determined non-invasively with the use of the MR phase images, the user can mark an advantageously circular region (as shown in image 22) in which the temperature information should be determined.

Figure 4:
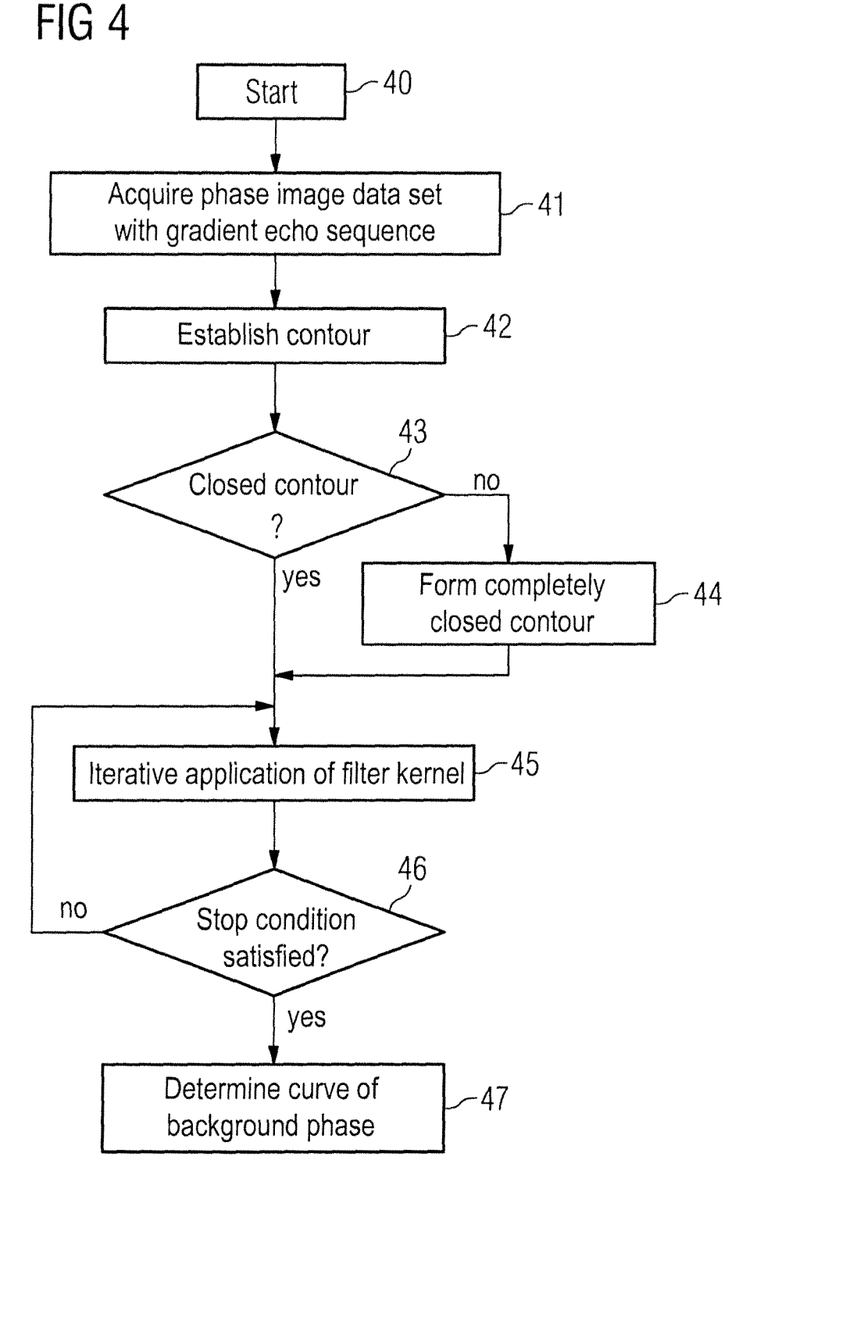
FIG. 4 is a flowchart with the primary steps to calculate the spatial curve of the background phase.

In reference to FIG. 4, this means that after the start of the method in Step 40 a phase image data set is acquired with a gradient echo sequence in which the fat signals are suppressed so that a phase image data set results as it is shown in image 21 of FIG. 2, for example (Step 41). In a next Step 42 an operator can then establish a contour around a partial region (ROI=Region of Interest; image 22) of the phase image data set as it is shown in image 23 of FIG. 2, for example. This contour is a planar contour and is at least one pixel in width. For example, the width of the contour can contain three pixels. This contour is advantageously placed in tissue with homogeneous susceptibility and in tissue that is not heated. The phase values in the region within the contour—i.e. in the partial region—can now be calculated with the aid of the phase value in the pixels in the planar contour and with the aid of a filter kernel.

In Step 43 it is checked whether the marked contour is a closed contour or an unclosed contour. In the event that the marked contour is a contour that is not completely closed, in Step 44 a completely closed contour is formed (as will be explained later in connection with FIG. 6-8). If a closed contour is now present, a filter kernel is then iteratively applied to the phase image data set in Step 45.

Figure 3:
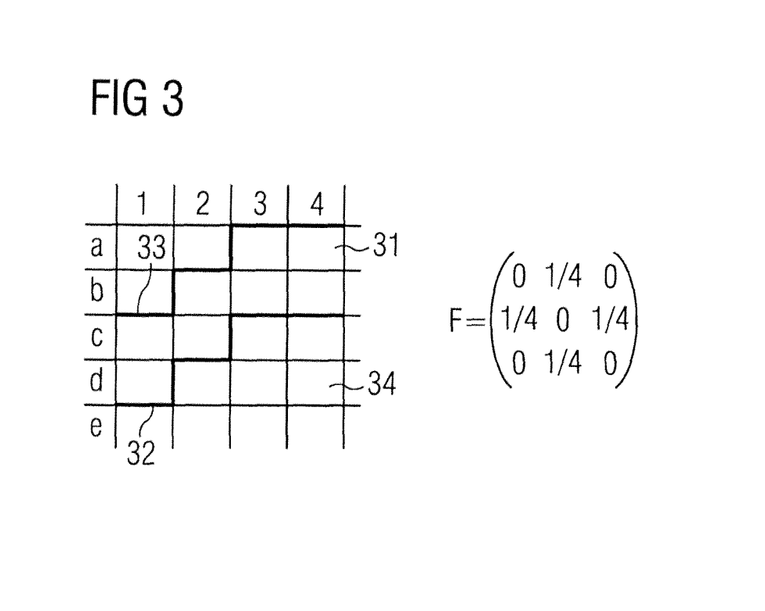
FIG. 3 is a partial section of a phase image data set with a planar contour and the application of a filter kernel to the phase image data set.
Figure 5:
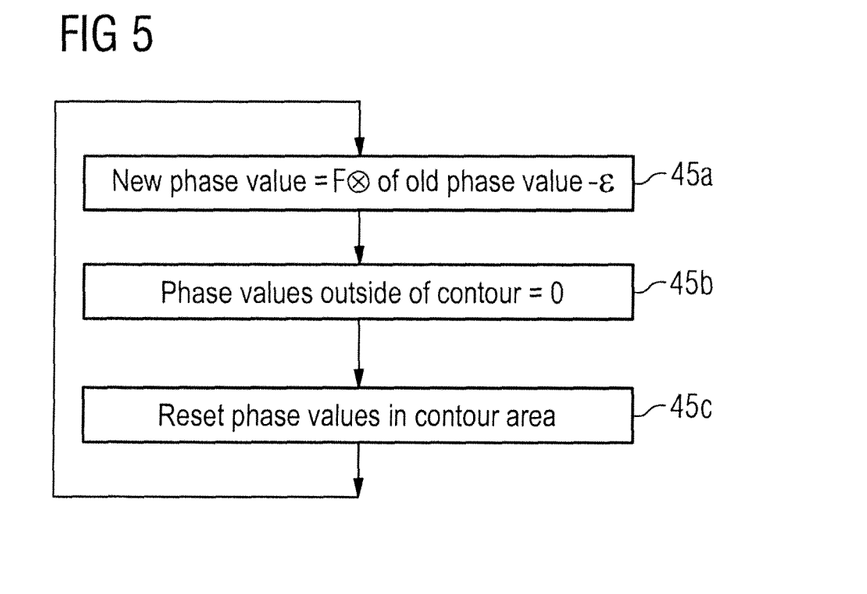
FIG. 5 is a flowchart that more precisely shows the method steps described during the application of the filter kernel.

The preferred filter kernel F is shown in FIG. 3. The phase values within the contour can now be calculated with this filter kernel. A partial region of an image with multiple pixels is shown enlarged in the left part of FIG. 3, wherein the contour 31 has a width of two pixels and is represented by the two lines 32 and 33. The steps used in the iterative application of the filter kernel are shown in detail in FIG. 5. In order to calculate a phase value in the partial region that is surrounded by contour 31 and is marked with reference character 34 in FIG. 3 (for example the pixels c3, c4, d2, d3 and d4), a folding of the phase values with filter kernel F ensues. Since this folding can be implemented in image space, it corresponds to a convolution of the phase values with the filter kernel. For example, the following calculation is executed to calculate the phase value in pixel c3 with the filter kernel shown in FIG. 3: ¼×phase value of b3+¼×phase value of c4+¼×phase value of d3+¼×phase value of c2. In the first application of the filter kernel, the phase values in the partial region 34 are set to an average value of the phase along the inner edge and the phase values in the planar contour 31 contain the measured phase values. After this convolution with the filter kernel, as shown in Step 45a of FIG. 5 the constant $\epsilon$ is subtracted (which constant describes—as mentioned above—the deviation of the phase curve from a harmonic function). In the next iteration Step 45b the phase values outside of the contour are set to zero, meaning the phase values in the pixels a1, a2 and b1 in the example of FIG. 3. In Step 45c of the iteration the phase values in the planar contour are then reset to their originally measured values before the multiplication with the filter kernel before Step 45a can be repeated. The calculation of the phase values inside the contour (i.e. in the partial region 34) can take place until the phase position calculated with the aid of the filter kernel no longer changes spatially or changes only slightly between two iteration steps. With regard to FIG. 4, this means that in Step 46 it is checked whether a stop condition to terminate the iteration is satisfied or not. This stop condition can depend on a number of implemented iterations, which in turn depends on the size of the partial region, or the stop condition can be set such that the iteration is terminated if the spatial phase curve no longer changes significantly from one iteration step to the next. Such a constructed background phase that was calculated in the examination region of the ROI from image 22 is shown by way of example in FIG. 2.

The constant $\epsilon$ enables the three-dimensional Laplace condition to be applied to 2 dimensions, for example as in the regions shown in FIG. 2. The smaller the ROI marked in image 22, the better this approximation. Before the heating an optimal value for $\epsilon$ that minimizes the standard deviation of the calculated temperature can be determined in the given ROI. Returning to FIG. 4, this means that in the event that the stop condition in Step 46 is satisfied, the background phase curve is determined in Step 47 as it is shown in image 34 of FIG. 2. If the background phase curve is now known, with the aid of the measured phase value the temperature can be determined in that the background phase is subtracted from the measured phase pixel by pixel. In addition to the determination in the image, $\epsilon$ can also be calculated as explained above. It was previously assumed that $\epsilon$ is a constant. However, it is also possible that $\epsilon$ is a function varying linearly in the partial region, for example. The calculation of $\epsilon$ can then ensue as follows: if one considers the average value of the phase in a 2D phase image in which the phase transitions at $2\pi$ were unwrapped, i.e. the phase $\phi(r,\theta)$ along a semicircle with given radius R that is rotated by an angle $\theta_0$, the following applies:

$$F_D(R, \theta_0) = \frac{\int_{\theta_0}^{\theta_0+\pi} \varphi(R, \theta) \cdot R \cdot d\theta}{\int_{\theta_0}^{\theta_0+\pi} R \cdot d\theta} = \frac{1}{\pi} \int_{\theta_0}^{\theta_0+\pi} \varphi(R, \theta) \cdot d\theta \tag{18}$$

Furthermore, the following function $\Psi(R,\theta_0)$ can be defined as follows:

$$\Psi(R, \theta_0) = \frac{d}{dR}\left(\frac{F_D(R, \theta_0)}{R}\right) = \frac{d}{dR}\left(\frac{1}{\pi \cdot R} \int_{\theta_0}^{\theta_0+\pi} \varphi(R, \theta) \cdot d\theta\right) \tag{19}$$

The spectral series of $\Psi(R,\theta_0)$ in which only $\theta_0$ is considered as a variable (since R at the circle is assumed to be constant) reads as follows:

$$\Psi(R, \theta_0) = \sum_{k=-N/2}^{k=N/2-1} \Psi^*(R, k) \cdot e^{i \cdot k \cdot \theta_0}, \tag{20}$$

wherein $\Psi^*(R,k)$ is the 1D Fourier transformation of $\Psi(R,\theta)$ along $\theta_0$ that is numerically implemented at N points via a standard complex FFT (Fast Fourier Transform) in one dimension. If the aharmonic terms greater than the 4th power are not considered now, it applies that a linear gradient of the Laplace operator along the direction y ($\nabla^2\phi=b\cdot y$) leads to an amplitude of the first frequency term in the spectrum of $\Psi$ that is not zero. This amplitude is given by:

$$|\Psi^*(R, k=1)| = \frac{R \cdot b}{4 \cdot \pi} \qquad (21)$$

The constant b can now be calculated from this as follows:

$$b = \frac{4 \cdot \pi}{R} \cdot |\Psi^*(R, k=1)| \qquad (22)$$

In general, if a uniform gradient of the Laplace operator exists, such as $$\nabla^2 \phi = \vec{G} \cdot \vec{r} = G \cdot r \cdot \cos(\theta - \theta_1) \quad \text{with} \quad \vec{G} = \vec{l}_x \cdot G \cdot \cos \theta_1 + \vec{l}_y \cdot G \cdot \sin \theta_1 \qquad (23)$$

the following relationship then applies and allows the calculation of G and $\theta_1$:

$$\Psi^*(R, k=1) = \frac{R \cdot G}{4 \cdot \pi} \cdot e^{i(\theta_1 - \frac{\pi}{2})} \qquad (24)$$

or, equivalently, $$\begin{cases} G = \frac{4 \cdot \pi}{R} \cdot |\Psi^*(R, k=1)| \\ \theta_1 = \frac{\pi}{2} + \arg(\Psi^*(R, k=1)) \end{cases} \qquad (25), (26)$$

The boundary function is numerically implemented as follows:

$$\Psi(R+1, \theta_0) = \frac{1}{2} \left[ \frac{F_D(R+2, \theta_0)}{R+2} - \frac{F_D(R, \theta_0)}{R} \right] = \frac{1}{2} \left[ \frac{\text{average phase at semicircle}(R+2, \text{rot}\_\theta_0)}{R+2} - \frac{\text{average phase at semicircle}(R, \text{rot}\_\theta_0)}{R} \right] \qquad (27)$$

Figure 6:
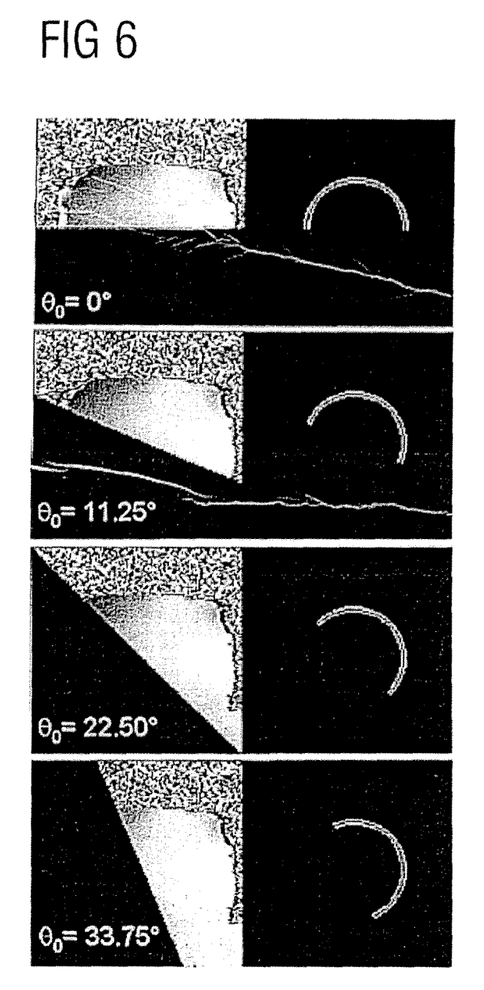
FIG. 6 schematically shows the plotting of an unclosed contour in a magnitude image of an examination subject.

The determination of the values of $\Psi(R+1,\theta_0)$ are described in the following. The values of $\Psi(R+1,\theta_0)$ in the phase image are determined incrementally after removal of the phase transition. Since $\Psi$ changes with the angle $\theta$, the phase values at the outer and inner semicircle are calculated for different values of $\theta_0$, for example with a step width of $2\pi/32$ as is shown in FIG. 6 for the first four Steps.

Figure 7:
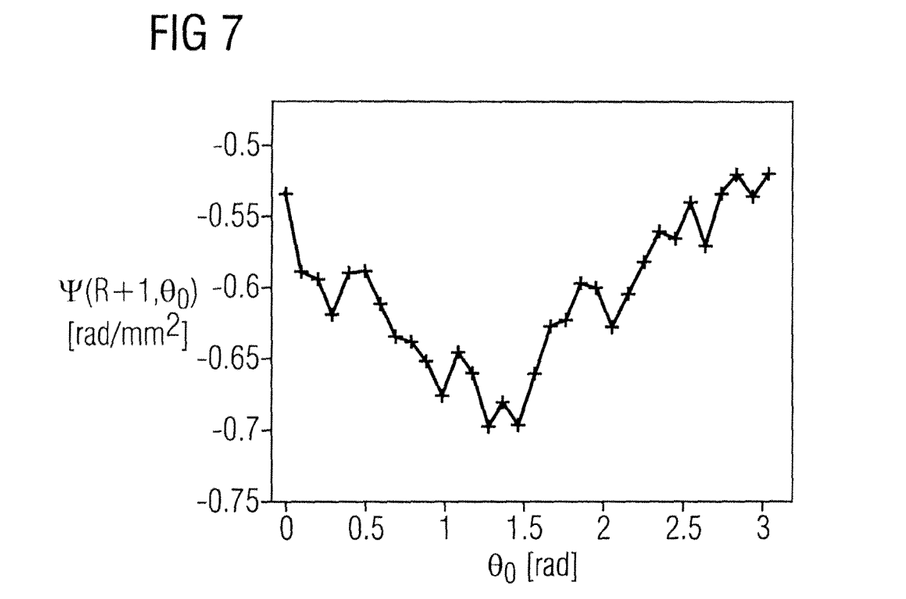
FIG. 7 is an example for the reconstruction of the missing contour area with the aid of a Fourier series.

The values of $\Psi(R+1,\theta_0)$ for different values of $\theta_0$ are now shown in FIG. 7. If the function curve of FIG. 7 is considered in detail, the curve of $\Psi$ (for example) can be considered as a cosine function, wherein the first amplitude is determined in the spectrum magnitude of the cosine.

Figure 8:
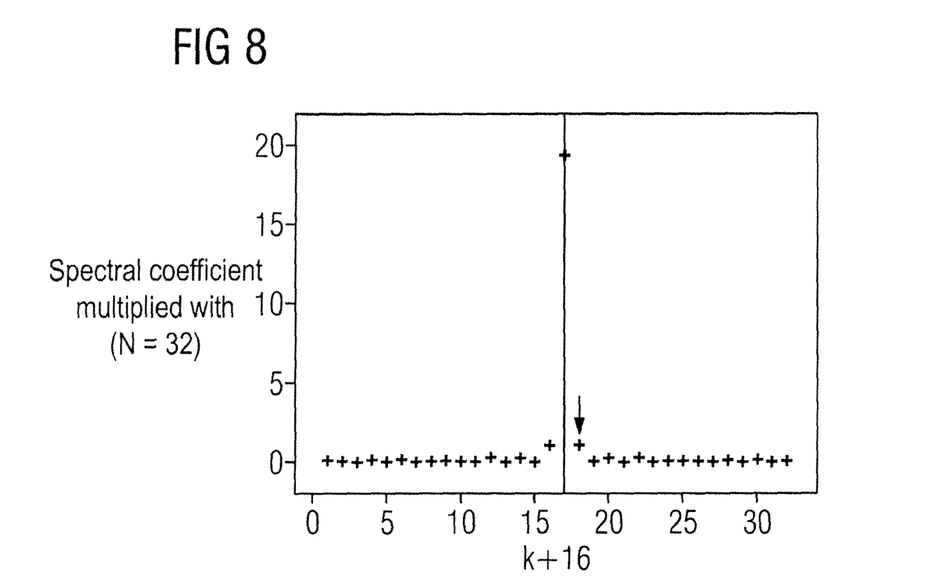
FIG. 8 shows the Fourier coefficients before and after a filtering.

The magnitude of the frequency spectrum of the function $\Psi(R+1,\theta_0)$ of FIG. 7 is shown in FIG. 8. The black arrow now shows the first frequency term of k=1. This first coefficient corresponds to the amplitude of the Laplacian gradient.

Under consideration of $\epsilon$ as a linear function, with knowledge of $\epsilon$, G and $\theta_1$ the phase reconstruction algorithm can now be executed as follows:

$$recPhase(n+1) = \\ conv2[recPhase(n), LapKernel] - \varepsilon - \frac{G \cdot r \cdot \cos(\theta - \theta_1)}{4} \qquad (29)$$

wherein recPhase(n+1) is the reconstructed phase value in iteration step n+1, the term conv2[recPhase(n), LapKernel] means the folding of the filter kernel with the phase values as described above in connection with FIG. 2-4, $\epsilon$ is calculated as above with the aid of Equation (16) and G and $\theta_1$ are specified as in Equations (25) and (26).

The selection of a closed contour in practice means a significant limitation since, first of all, the susceptibility in this contour should be homogeneous and the tissue shown in the contour should not be heated.

Figure 9:
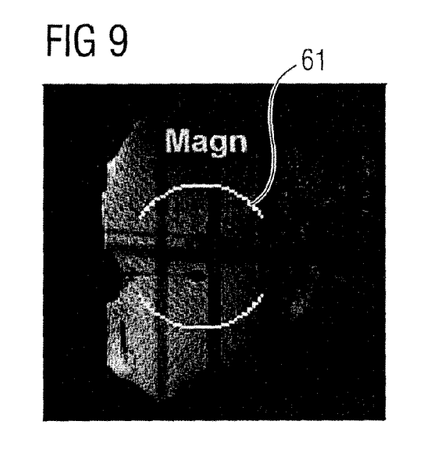
FIG. 9 shows the comparison of a temperature calculation with the method according to the invention and with a method in which two phase image data sets are subtracted from one another as in the prior art.

A magnitude image with a marked contour 61 that is not closed is shown in FIG. 9. for example, the temperature in proximity to the circle center of the indicated contour should be determined, wherein the tissue is heated by focused ultrasound. The beam path of the ultrasound is, for example, such that the tissue was heated by the ultrasound in the regions in which no contour is marked, such that the pixels situated there cannot be used for the contour without additional measures.

An extension of the described method is now possible in which the contour does not need to be closed but rather in which the contour should only enclose more than half of a complete circle in total. For the calculation it is additionally assumed that the unused portion of the contour likewise lies on the circle. It is in this case necessary to determine the phase curve on a slice, wherein the phase values in the border region (i.e. in the contour as shown in FIG. 9 are partially known, i.e. are known in the upper and lower region of the circle. This approximation is based on the depiction of the circular slice in polar coordinates, wherein the spatial phase curve corresponds to a harmonic function within a slice:

$$f(r, \theta) = \sum_{k=0}^{\infty} [(\alpha_k \cdot \cos(k\theta) + \beta_k \cdot \sin(k\theta)) \cdot r^k] \qquad (30)$$

This function is defined by the Fourier coefficients $\alpha_k$ and $\beta_k$. The radius r at the edge of the slice is constant, such that the function is a Fourier series in one dimension:

$$f(\theta) = \sum_{k=0}^{\infty} (\alpha'_k \cdot \cos(k\theta) + \beta'_k \cdot \sin(k\theta)) \qquad (31)$$

If the information at a portion of the circle is now absent, this can be determined with the aid of the Fourier series property.

Figure 10:
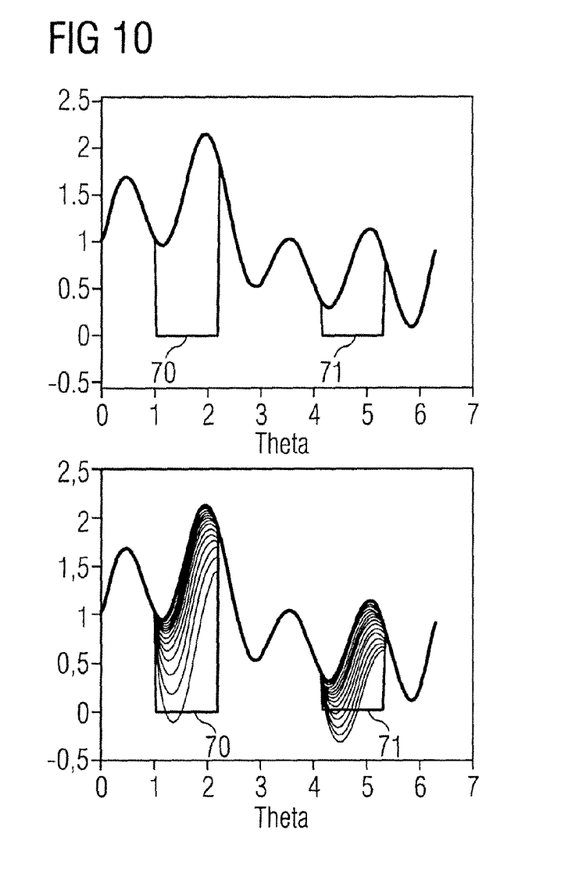
FIG. 10 is a graph showing the dependency of Fourier coefficients on the variable Theta.
Figure 11:
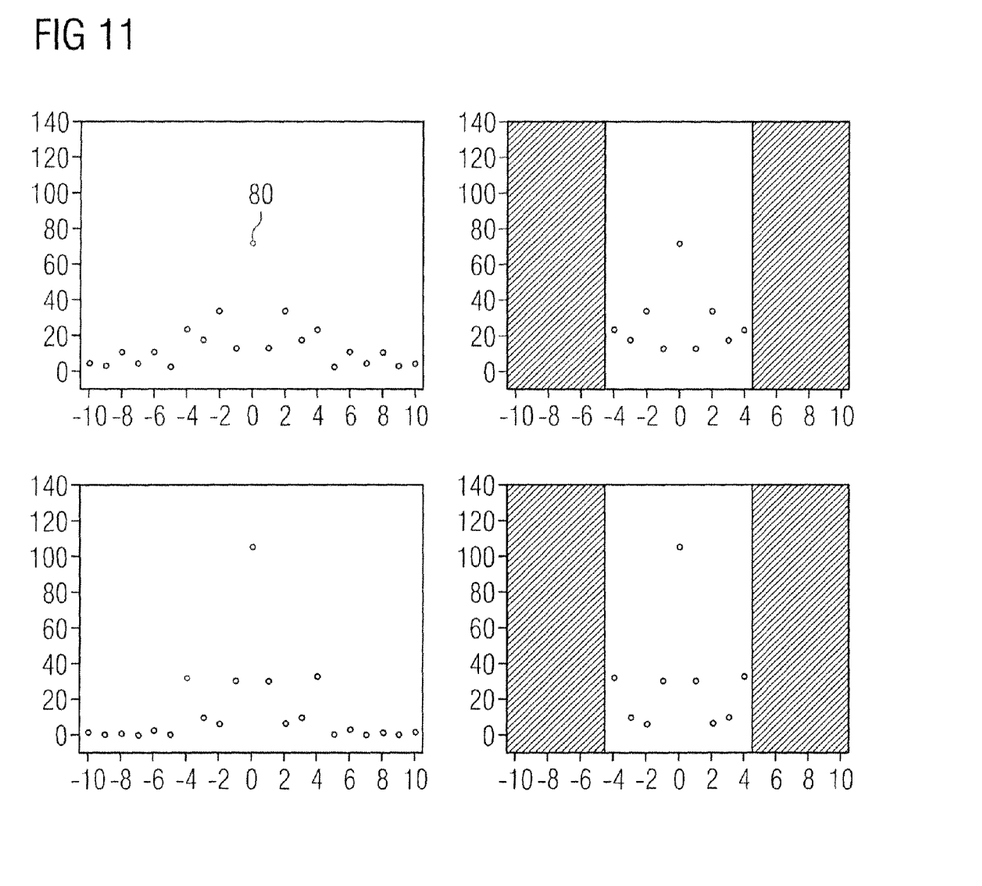
FIG. 11 shows respective values of Fourier coefficients, and selected truncations thereof.

The Fourier coefficients dependent on $\theta$ (Theta) are shown in FIG. 10, wherein the elements of the circle contour that are missing in FIG. 9 are shown by the segments 70 and 71. With regard to the upper portion of FIG. 10, this means that the known information is retained and $f(\theta)$ from Equation (12) is set to zero in the missing regions. In a next step the function $f(\theta)$ is Fourier-transformed and coefficients that are higher than a limit value in the Fourier spectrum that is thereby achieved are set to zero. In FIG. 11 the Fourier coefficients 80 are shown in the left upper image, wherein it is apparent that the values fall quickly from around a peak to zero. If all coefficients greater than a predetermined value—here 4, for example, as is shown in the right upper image of FIG. 11—are now set to zero, a spectrum results as is shown in the left lower image of FIG. 11. As is shown in the right lower image of FIG. 11, the larger coefficients can now be truncated and in a next step the inverse Fourier transformation of the truncated spectrum can be generated. As is shown in FIG. 7b, the missing information can then be reconstructed in the regions 70 and 71 via iterative application of the method described in FIGS. 10 and 11. This means that the following steps are implemented iteratively after the known contour information has been retained and the high rank Fourier coefficients have been set to zero:

Fourier transformation of the function f(θ); truncation of the Fourier coefficients greater than a predetermined threshold (here 4); inverse Fourier transformation of the truncated spectrum; and resetting of the values in the known pixels for f(θ) to the original values. The Nyquist criterion is satisfied in this approximation if a contour with two mirror-image circle segments as shown in FIG. 9 is used, wherein each circle segment is greater than a quarter-circle, such that in total the contour comprises more than a half circle.

Figure 12:
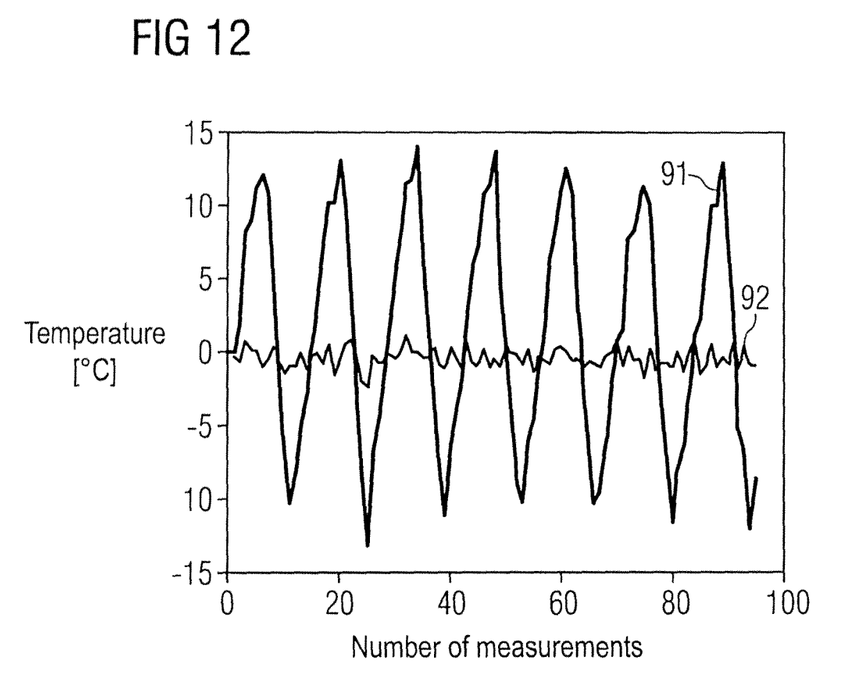
FIG. 12 schematically illustrates the use of the inventive method for calculating a temperature change in the context of magnetic resonance imaging.

The method described above to determine the background phase offers multiple advantages: first, the influence of the magnetic field drift over time is prevented with this referenceless method. This likewise applies for the current drift over time in the shim coils. Since the method is not based on the subtraction of two phase image data sets, it is also less susceptible to the movement of the examined tissue. This is shown in FIG. 12, for example. In FIG. 12 the temperature change calculated via the phase position given movement of the examination subject is shown, wherein the examined subject was moved periodically. The curve 91 shows the temperature change calculated from the phase change as it was determined with the aid of calculating the difference of two phase data sets. The curve 92 describes the temperature change determined based on the phase change, wherein the phase change was calculated with the method described above. As is apparent from these two curves, the method according to the invention is much less susceptible to movements of the examined tissue.

Although modifications and changes may be suggested by those skilled in the art, it is the intention of the inventor to embody within the patent warranted hereon all changes and modifications as reasonably and properly come within the scope of his contribution to the art.

We claim as our invention:

1. Method determine a background phase in phase values of a phase image data set that is acquired from an examination subject, wherein the background phase is determined in a partial region of the phase image data set, comprising the following steps of:
   providing magnetic resonance phase image data set acquired from the examination subject to a computerized processor;
   through an input unit in communication with the computerized processor, manually establishing a substantially closed, planar contour in the phase image data set around the partial region, the planar contour having a contour area with a width of at least one pixel of the phase image data set;
   in said computerized processor, automatically determining the phase values in the partial region from an assumption that the spatial curve of the background phase is a harmonic or quasi-harmonic function, by determining the phase values of the pixels in the partial region based on the phase values in the planar contour by iterative application of a filter kernel to the pixels in the partial region and to the pixels in the planar contour.

2. Method according to claim 1, comprising establishing the planar contour in a region of the examination subject in which the tissue of the examination subject has an essentially homogeneous susceptibility.

3. Method according to claim 1, comprising employing a 3 by 3 filter kernel in said interactive application.

4. Method according to claim 3, comprising designing said 3 by 3 filter kernel as:

$$F = \begin{pmatrix} 0 & 1/4 & 0 \\ 1/4 & 0 & 1/4 \\ 0 & 1/4 & 0 \end{pmatrix}.$$

5. Method according to claim 1, comprising determining the phase values in the partial region by convolving the phase values in the partial region and the planar contour with the filter kernel.

6. Method according to claim 1, comprising, before every iterative application of the filter kernel, resetting the phase values in the planar contour to their respective original phase values that have resulted from the acquisition of the phase image data set of the examination subject.

7. Method according to claim 1, comprising determining the phase values in the partial region by iterative application of a filter kernel to the pixels in the partial region and to the pixels in the planar contour, and acquiring the phase image data set as a two-dimensional phase image data set and iteratively determining the phase values in the partial region under an assumption that the spatial curve of the background phase is a harmonic function, and, in the iterative determination of the phase values in the partial region, using a parameter ϵ that represents the non-harmonic portion of the spatial phase curve.

8. Method according to claim 7, wherein the parameter ϵ is a constant and is determined with the aid of the phase values in the planar contour.

9. Method according to claims 7, wherein the parameter ϵ is a linear function in the partial region.

10. Method according to claim 1 comprising determining the phase values in the partial region by iterative application of a filter kernel to the pixels in the partial region and to the pixels in the planar contour, and determining the phase values until a difference in the phase values in the partial region between two iteration steps is smaller than a determined limit value.

11. Method according to claim 1, comprising acquiring the phase image data set with a gradient echo sequence with fat suppression.

12. Method according to claim 1, comprising designing the substantially closed contour to be circular, and comprising at least a semicircle.

13. Method according to claim 1, wherein the substantially closed contour is an incompletely closed contour, and closing the incompletely closed contour by a contour extension to form a closed contour, and determining the phase values in the contour extension based on the phase values in the pixels of the incompletely closed contour, and determining the phase values in the partial region based on the phase values in the closed contour.

14. Method according to claim 13, comprising determining the phase values in the contour extension under an assumption that the spatial phase curve corresponds to a harmonic function expressed as a Fourier series, and considering only a predetermined number of Fourier coefficients in the Fourier series.

15. Method according to claim 1, comprising determining a temperature difference in a heated tissue by placing the substantially closed contour in an unheated region of the tissue.

16. A computerized processing system for determining a background phase in phase values of a phase image data set acquired from an examination subject, said background phase being determined in a partial region of the phase image data set, said computerized processing system comprising:
 a computerized processor;
 a memory unit accessible by said processor that provides said processor with a phase image data set that was acquired from the examination subject,
 an input unit in communication with said processor, said input unit being configured to allow an operator to establish a substantially closed, planar contour around the partial region in the phase image data set, the planar contour having a contour area with a width of at least one pixel of the phase image data set, and
 said processor being configured to calculate, from an assumption that the spatial curve of the background phase is a harmonic or quasi-harmonic function, phase values in the partial region, by determining the phase values of the pixels in the partial region using the phase values in the pixels of the planar contour by iterative application of a filter kernel to the pixels in the partial region and to the pixels in the planar contour.

17. A non-transitory computer-readable storage medium encoded with programming instructions, said storage medium being loaded into a computerized processing system and said programming instructions causing said computerized processing system to:
 receive magnetic resonance phase image data set acquired from the examination subject;
 receive a designation of a substantially closed, planar contour in the phase image data set around the partial region, the planar contour having a contour area with a width of at least one pixel of the phase image data set;
 automatically determine the phase values in the partial region from an assumption that the spatial curve of the background phase is a harmonic or quasi-harmonic function, by determining the phase values of the pixels in the partial region based on the phase values in the planar contour by iterative application of a filter kernel to the pixels in the partial region and to the pixels in the planar contour.

* * * * *